(12) United States Patent
Miller (10) Patent No.: US 7,788,308 B2
(45) Date of Patent: Aug. 31, 2010

(54) FREQUENCY FLOAT METHOD AND SYSTEM FOR REALIZING A SIGNAL FILTER

(75) Inventor: Ray Miller, Mukilteo, WA (US)

(73) Assignee: Rane Corporation, Mukilteo, WA (US)

( * ) Notice: Subject to any disclaimer, the term of this patent is extended or adjusted under 35 U.S.C. 154(b) by 1199 days.

(21) Appl. No.: 11/385,106

(22) Filed: Mar. 20, 2006

(65) Prior Publication Data

US 2007/0220077 A1    Sep. 20, 2007

(51) Int. Cl.
*G06F 17/10* (2006.01)
(52) U.S. Cl. ...................................................... 708/300
(58) Field of Classification Search .......... 708/300–323
See application file for complete search history.

(56) References Cited

U.S. PATENT DOCUMENTS

| | | | | |
|---|---|---|---|---|
| 5,226,059 A | * | 7/1993 | Fasterling | 375/230 |
| 5,530,720 A | * | 6/1996 | Marguinaud | 375/232 |
| 6,226,049 B1 | * | 5/2001 | Oh | 348/607 |
| 6,263,354 B1 | | 7/2001 | Gandhi | |

* cited by examiner

*Primary Examiner*—Tan V Mai
(74) *Attorney, Agent, or Firm*—Kevin D. Jablonski; Graybeal Jackson LLP (57) ABSTRACT

A method for realizing a digital filter in an electronic system. The method includes first determining the specific number of coefficients to be calculated for a design filter and calculating the value of some of the coefficients for the design filter, typically all but one. Next, a reference filter is selected having the same number of coefficients as the design filter and each coefficient of the reference filter is calculated. With the reference filter's coefficients, the method concludes by determining the value of the remaining coefficients of the design filter that were previously not calculated. The determination is based upon an arithmetic comparison to the coefficients of the reference filter. The system and method improve second-order filter response for certain filters implemented with a direct-form topology.

15 Claims, 4 Drawing Sheets

FREQUENCY FLOAT METHOD AND SYSTEM FOR REALIZING A SIGNAL FILTER

BACKGROUND OF THE INVENTION

In systems and processes that utilize signal processing, the function of a filter is to remove unwanted parts of the signal, such as random noise, or to extract useful parts of the signal, such as the components lying within a certain frequency range. Depending on the type of signal being dealt with, filters may be analog or digital. An analog filter uses analog electronic circuits made up from components such as resistors, capacitors, and op amps to produce the required filtering effect. Such filter circuits are widely used in such applications as noise reduction, video signal enhancement, graphic equalization, and many others. Differently, a digital filter uses a digital processor to perform numerical calculations on sampled values of the signal. The processor may be a general-purpose computer such as a personal computer, or a specialized DSP (Digital Signal Processor) chip. In many of today's electronic systems, digital filters are more and more prevalent, as digital signals are more and more prevalent.

Figure 1:
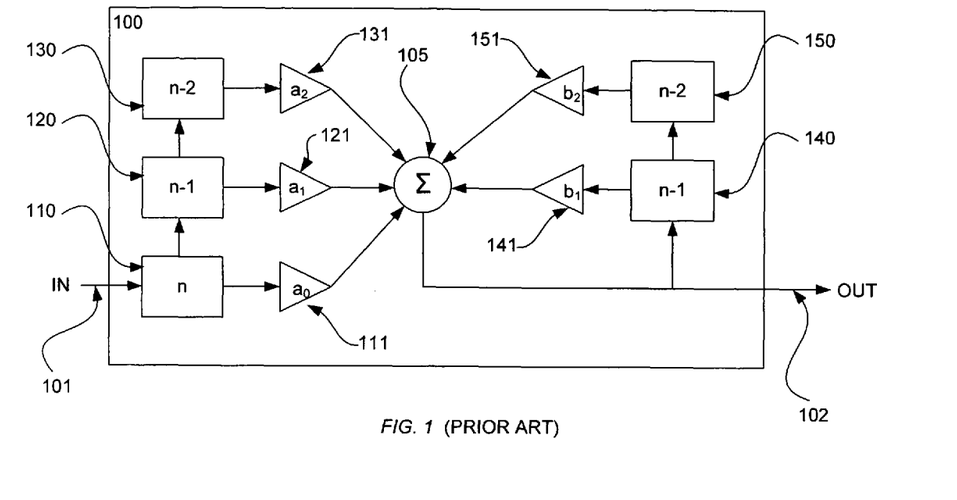
FIG. 1 shows a block diagram of a conventional direct form, second-order digital, Infinite Impulse Response (IIR) filter.

One common type of digital filter typically used in digital signal processing is a direct form, second-order digital, Infinite Impulse Response (IIR) filter. FIG. 1 shows a block diagram of this kind of conventional digital filter 100. As can be seen, a digital signal may be input to the filter at an input point 101. Here, a series of discrete-time signals representing a digitally quantized analog signal is streamed into the filter 100. The discrete-time signal, called $x_{(n)}$, is passed through five transforms and summed to produce an output signal, $y_{(n)}$ where n represents the digital signal at point n in time. The five transforms introduce a time shift and a multiplier coefficient. As such, a first transform includes a first time shift block 110 for $x_{(n)}$ and a first multiplier coefficient block 111 with a first coefficient $a_0$. A second transform includes a second time shift block 120 for $x_{(n-1)}$ and a second multiplier coefficient block 121 with a second coefficient $a_1$. A third transform includes a third time shift block 130 for $x_{(n-2)}$ and a third multiplier coefficient block 131 with a third coefficient $a_2$. A fourth transform includes a fourth time shift block 140 for $y_{(n-1)}$ and a fourth multiplier coefficient block 141 with a fourth coefficient $b_1$. Finally, a fifth transform includes a fifth time shift block 150 for $y_{(n-2)}$ and a fifth multiplier coefficient block 151 with a fifth coefficient $b_2$.

As digital signals are passed through the filter 100, the resulting output (at an output point 102) is realized by summing (at the summer 105) all five signals as modified by the coefficients of the digital filter 100. The resulting Z-transform for several filter types is as follows:

$$Y(z) = x(z) \frac{a_0 + a_1 z^{-1} + a_2 z^{-2}}{1 - b_1 z^{-1} - b_2 z^{-2}}$$

By adjusting the coefficients (i.e., designing a digital filter), any type of digital filter may be realized including, band-pass, high-pass, low-pass, high-shelf, low-shelf, etc.

This kind of digital filter 100 may typically be designed and used for parametric and graphic equalization with high efficiency and little susceptibility to overload according to known design techniques. However, the frequency response of the digital filter 100 becomes unpredictable when the design frequency (i.e., the center frequency of the filter that is desired to be boosted or attenuated) is a lower frequency. By low frequency, it is understood that with respect to the human range of hearing, a low frequency typically includes frequencies below 100 Hz. When designing for low frequency filtering, the filter coefficients that need to be implemented in order to control the frequency response are confined to a limited number of design choices because of coefficient quantization. When using IIR digital filters, a precise number of bits is allowed for representing discrete-time signals. Often referred to as numeric resolution, a specific number of bits (typically 24 or 32) is used to represent the input signal, coefficients, intermediate calculations, and the resulting output.

As the number of bits is a limiting factor, this results in direct-form filters having more response error for low-frequency digital filters. Quantization is a process where a continuous value (a real number) is translated into a fixed precision representation. The difference between the original value and the quantized value is the quantization error. Quantization error can cause a filter response that is different from the desired filter in amplitude and phase at a given frequency. The difference is the filter response error.

Figure 2:
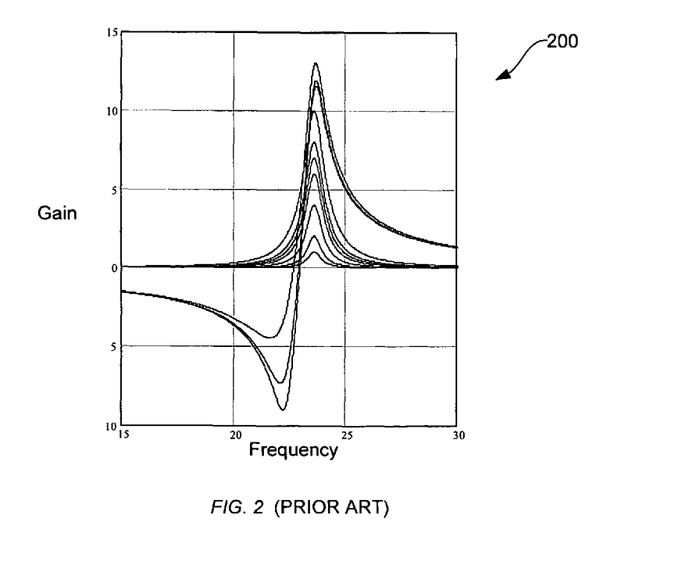
FIG. 2 shows a graphical representation of several superimposed frequency responses of a digital filter designed according to conventional methods.

This effect of quantization error is illustrated in FIG. 2 where several combinations of filter coefficients are superimposed onto a single graph 200. In general, the five coefficients of the filter 100 correspond to filter parameters more easily understood by a user or filter designer. As such, filters are typically described as having a center frequency, Q, and gain. A center frequency refers to the frequency at which a bell peaks. Q, sometimes called a Q-rating or Q-setting, refers to the width of the bell curve at specific points in the bell (sometimes these points are synonymous with −3 dB points, but not always). The measurement points for Q are somewhat arbitrary, so long as the points remain the same from curve to curve for measurement and comparison reasons. Finally, gain refers to the gain setting resulting in a gain or attenuation at the center frequency. Together, these parameters describe features of a filter that may be adjusted by a user.

In this example, a set of coefficients for a bell-filter is realized with a center frequency of approximately 23 Hz, with a Q of about 33, and a gain varied over several different responses. In general, the filter response error increases when: the center frequency decreases, the sample rate increases, and/or the Q of the filter increases.

In theory, the example curves should be "stacked" as if increasingly larger mirror images of themselves, each having the same center frequency and Q with the output level being the only difference from response to response. However, as can be seen as the output level is adjusted, each curve yields a different center frequency. Somewhat less detectable by the naked eye in this graph are small changes in Q as the output level is adjusted as well. Thus, any signal passing through this filter would be affected differently as the output level is increased. A similar phenomenon occurs if the Q is adjusted while holding the output level constant. This scenario is not shown herein, however.

The graphical illustration of FIG. 2 is an exaggerated scenario that would easily be noticed by any technician. Typically, these response errors are much smaller and less-easily noticed. Nevertheless, the response error exists and is quantifiable. In the past, this error has typically been ignored as the error goes unnoticed by an average filter user. That is, even if a system claims that a filter is filtering at 20 Hz, it is more likely that it is really a filter having some center frequency that is close, but not precisely 20 Hz; i.e., a 20.7 Hz filter, for example.

Thus, a system could possibly employ a "trial and error" method of realizing a digital filter by choosing a number of coefficients for the digital filter that achieved filter parameters inputted by a user (i.e., via pots or controls over center frequency, Q, and gain) to be close enough while still maintaining a predictable response. As systems allow for an end-user to have full parametric control of a filter, a designer must either provide coefficient combinations for all possibilities of parametric settings, or use trial and error when a parameter changes. While achievable, such a large storage of filter data or searching is cumbersome and inefficient. As such, one realization method preserves filter shape (type), but leaves a filter design that may be subject to small unpredictable errors in the center frequency. What remains is a static frequency error that is typically less than 1 Hz at low-frequencies. Higher design frequencies reduce the error as a 40 Hz filter has about half the error of a 20 Hz filter.

Other solutions exist for alleviating this quantization error. One such solution is to use a higher bit-precision which results in a frequency error reduction of about one-half for each bit. Even so, at least a 32-bit fixed point or 40-bit floating point system would be needed for typical applications. 32-bit floating point has a resolution of only about 24 bits, with the remaining bits devoted to sign and exponent. Using higher precision, such as 48 bits, is possible, but at the expense of additional processing power.

There are alternatives to direct form digital filters, such as coupled and lattice forms. These filters typically require significantly more computation and have many other tradeoffs, such as noise performance, overload susceptibility, quantization sensitivity, support for various filter types, and additional sample delays. Thus, an efficient and reliable method for efficiently and more precisely realizing direct form, IIR digital filters is desired.

SUMMARY OF THE INVENTION

According to one embodiment of the invention, a method for realizing a digital filter is accomplished. The method comprises first determining the specific number of coefficients to be calculated for a digital filter and calculating the value of some of the coefficients for the digital filter, typically all but one independent coefficient. Next, a reference filter is selected having the same number of coefficients as the design filter and each coefficient of the reference filter is calculated. With the reference filter's coefficients, the method concludes by extrapolating the value of the remaining uncalculated independent coefficients of the digital filter not calculated based upon an arithmetic comparison to the coefficients of the reference filter.

The invention improves second-order, IIR filter response for certain filters implemented with a direct-form topology. One of these is the bell filter, and others that benefit include band-pass, low-pass, and high-pass types. Some degree of quantization error is unavoidable, but the present invention controls the character and amount of error when designing a digital filter. A more accurate and precise frequency response is ensured by means of a filter-type correction technique and a frequency float technique Control parameters input by a user may be used to calculate the five coefficients of the design filter. The invention stabilizes the design frequency of the response by means of rules and formulas applied to make small adjustments to some of the coefficients, based on control parameters, wherein one or more of the other coefficients are left unchanged. One portion of the method applies formulas which are relations between coefficients. These are applied to determine some coefficients (referred to here as dependent coefficients) from others (independent coefficients), but only after these are quantized. The formulas only involve additions, subtractions, and multiplication by an integer, all of which can be done with zero error.

The method continues to a second portion wherein one of the independent coefficients is modified, so as to prevent abrupt shifts in frequency. This is done by designing a second "reference" filter, with the same center frequency and Q determined as a function of the center frequency. The reference filter is used in combination with all but one of the independent coefficients after quantization to form the last independent coefficient of the design filter, using another formula that sets the desired filter frequency practically equal to the reference filter's (after its coefficients are quantized). Then, in a final step, the dependent coefficients are determined using the previously known formulas.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The following discussion is presented to enable a person skilled in the art to make and use the invention. The general principles described herein may be applied to embodiments and applications other than those detailed above without departing from the spirit and scope of the present invention. The present invention is not intended to be limited to the embodiments shown, but is to be accorded the widest scope consistent with the principles and features disclosed or suggested herein.

Figure 3:
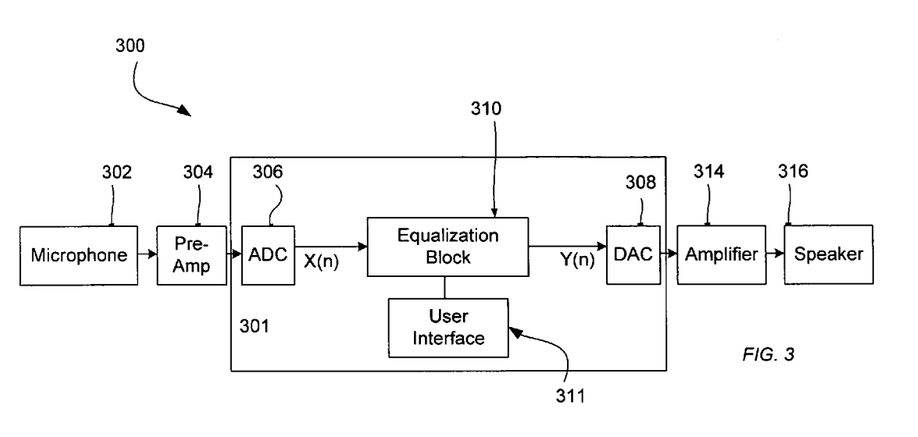
FIG. 3 shows a block diagram of a typical electronic system for realizing a digital filter formed in accordance with an embodiment of the invention.

FIG. 3 shows a block diagram of a typical electronic system 300 for realizing a digital filter block 301 formed in accordance with an embodiment of the invention. The electronic system 300 includes a number of components that may or may not be present in conjunction with the invention. As such, the system described herein with respect to FIG. 3 is for exemplary purposes only and any of the described components need not be present in an electronic system 300 formed according to various embodiments of the present invention.

In FIG. 3, the electronic system 300 includes a microphone 302 that converts acoustic sound waves into a series of electrical signals, i.e., an analog audio signal. The electrical signal may then be amplified by a microphone preamplifier 304 and then sent to an Analog-to-Digital Converter (ADC) 306. The ADC 306 converts an analog signal to a digital signal according to known standards and typically converts the analog signal into a digital signal having a bit depth of 24 bits at a sample rate of 48 kHz and higher. As the bit depth and sample rate increase, so does the cost and complexity of the system. As such, bit depth and sample rate of 24 bits at 48 kHz is common in today's applications. Other sample rates, such as 96 kHz, and other bit depths, such as 32 bits, may also be used in some applications.

The ADC 306 generates a digital signal, labeled as X(n), which may then be sent to an electronic device for realizing one or more digital filters, such as any digital filters within an equalization block 310, and processed accordingly (described in greater detail below).

As the signal X(n) is fed to the equalization block 310, a user may use an interface 311 for inputting, controlling, adjusting, or otherwise affecting digital filters to which the signal X(n) will be subjected. The output signal Y(n) represents the input signal X(n) after being filtered by any digital filters realized in the equalization block 310. The signal Y(n) may then be sent to a Digital-to-Analog Converter (DAC) 312 with equivalent parameters to those of the ADC 306. The analog signal may then be amplified by amplifier 314 and converted back to acoustic sound waves by a speaker 316.

Typically, the digital filter block 301 may be embodied in a rack-mounted unit consistent with audio components of the industry. Alternatively, the digital filter block 301 may be realized wholly within a computing environment such as a rack mountable computer, a standalone computer, a server computer, a laptop computer, or a desktop computer. Similarly, the user interface 311 may be embodied in a program running on an attached computing environment or computer platform from which users parameters are controlled. Also alternatively, the user interface 311 may be a set of switches configured by a user on an attached piece of hardware.

With this electronic system 300, a user may realize any number of digital filters for affecting the signal X(n). Such filters capable of being created and implemented by a user include a peaking filter, a bell-filter, a parametric filter, a band-pass filter, a band-cut filter, a low-pass filter, a high-pass filter, a low-cut filter, a high-cut filter, a high-shelf filter, a low-shelf filter, and a unity filter. In realizing such digital filters, a user need only specify the value of the coefficients of the digital filter 100 described above with respect to FIG. 1. It is noted that for some filters, all five elements need not necessarily be present, however, this may be simply thought of as having a coefficient of zero for any element not needed to realize a particular kind of digital filter. As such, a number of formulas are available for correlating the various coefficients to each other based upon the kind of filter to be realized. All known formulas will not be presented herein, but rather enough formulas to provide an understanding of the invention.

One such digital filter that may be realized by the invention is a digital biquad filter which is similar in nature to the digital filter of FIG. 1. A digital biquad filter is a second-order, recursive filter with the capability of resonance. Digital biquad filters may typically be the building blocks (along with first-order filters) for higher-order filters such as those that are used in crossover networks. These filters have poles and zeros much like their analog counterparts, but these are adjusted by corresponding coefficients, i.e., $a_0$, $a_1$, $a_2$, $b_1$, and $b_2$ instead of resistors and capacitors. Direct form biquad filters have five coefficients that can be adjusted to realize low-pass, band-pass, shelving, and bell filters, among others.

One such frequency response typically desired for audio signal shaping is a bell filter which may also be referred to as a peaking filter, or a true parametric filter. Bell filters are described as having three parameters that define the shape of the frequency response; center frequency, Q, and gain.

When first realizing a digital filter, a user may specify the center frequency, Q, and gain desired. This information may be input to the electronic system 300 via the user interface 311. When these parameters are received, the digital filter block 301 may then use the parameters to determine the appropriate coefficients to establish that will yield a digital filter with the desired parameters. This process is accomplished via a method described in the flowchart of FIG. 4.

Figure 4:
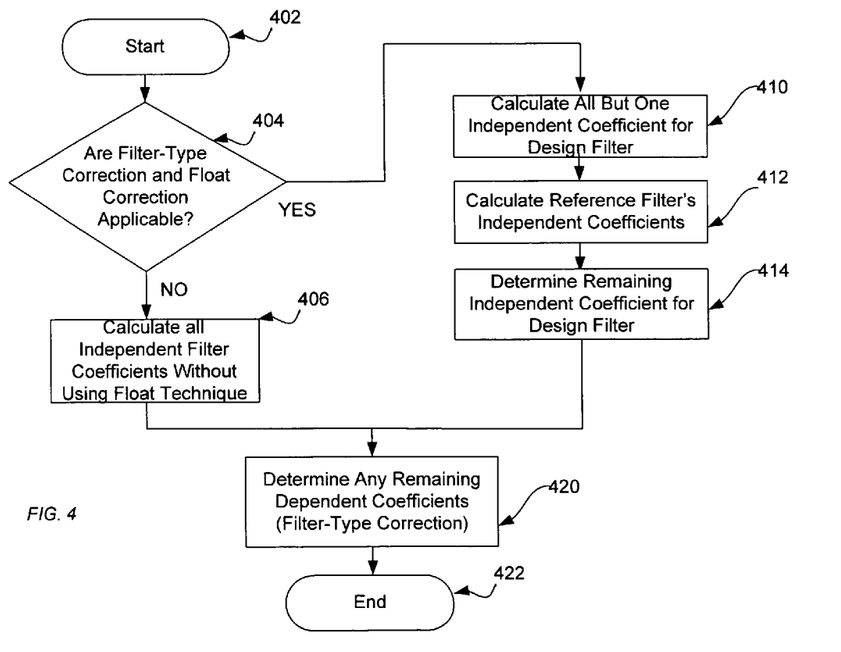
FIG. 4 shows a flow chart of a method for realizing a digital filter according to an embodiment of the invention.

FIG. 4 shows a flow chart of a method for realizing a digital filter according to an embodiment of the invention. The method starts at step 402 and a decision block is next presented which allows for two options at step 404. As described in the background, when the center frequency desired for the digital filter is low enough, unpredictability is a factor that affects the realization process. Thus, at step 404, it is first decided whether or not to employ the realization method or not.

If predictability is not going to be a factor (e.g., the center frequency is quite high, precision is not important to the user, etc.), then the process simply jumps to step 406. Here, some coefficients are calculated according to known formulas and not according to the tandem process of filter-type correction and frequency float techniques of the invention. Any remaining dependent coefficients are then determined according to filter-type correction techniques (not in conjunction with any frequency float correction techniques), at step 420, from the above-mentioned pool of formulas available for realizing various kinds of filters. The method then ends at step 422 without ever employing the inventive techniques.

However, in situations where precision is required or predictability is a factor because of the desired filter parameters, the filter-type correction and frequency float technique may be selected at decision block 404. As the graph in FIG. 2 shows, simply calculating the five coefficients and then quantizing them can lead to intolerable response degradation, where the bell shape unexpectedly turns into a shelving filter with high Q. This is due to the fact that quantization causes the poles and zeros lose their finely balanced alignment which then leads to unpredictability in filter realization. As such, two methods may be used in conjunction with each other to bring about more predictability. A filter-type correction technique may be employed to alleviate some of the problem, but it is best when coupled with a frequency float technique as well. In FIG. 4, the filter type correction technique is accomplished at step 420, which occurs after the frequency float technique is applied in steps 410-414. These techniques are described in more detail below.

If these correction steps are to be undertaken, the method proceeds to the tandem techniques of frequency float correction and filter-type correction. The method first proceeds to the three steps (410-414) of the frequency float correction technique. Here, all but one of the independent coefficients are calculated at step 412 based upon the control parameters using specific formulas that are unique to each type of filter. The calculated coefficients are quantized to the target word size. Examples of these formulas given here for several filter types, given the previously presented transfer function:

$$\frac{a_0 + a_1 z^{-1} + a_2 z^{-2}}{1 - b_1 z^{-1} - b_2 z^{-2}}$$

Bell-filter (Boost)

$$a_0 = \frac{g\sin(\theta_o) + 2Q}{\sin(\theta_o) + 2Q},\ a_1 = \frac{-4Q\cos(\theta_o)}{\sin(\theta_o) + 2Q},\ a_2 = \frac{2Q - g\sin(\theta_o)}{\sin(\theta_o) + 2Q}$$

Bell-filter (Cut)

$$a_0 = \frac{\sin(\theta_o) + 2Q}{g\sin(\theta_o) + 2Q},\ a_1 = \frac{-4Q\cos(\theta_o)}{g\sin(\theta_o) + 2Q},\ a_2 = \frac{2Q - \sin(\theta_o)}{g\sin(\theta_o) + 2Q}$$

Band-pass ($b_1$ may not be needed)

$$a_0 = \frac{\sin(\theta_o)}{\sin(\theta_o) + 2Q},\ b_1 = \frac{4Q\cos(\theta_o)}{\sin(\theta_o) + 2Q}$$

High-pass ($b_1$ may not be needed)

$$a_0 = \frac{Q + Q\cos(\theta_o)}{\sin(\theta_o) + 2Q},\ b_1 = \frac{4Q\cos(\theta_o)}{\sin(\theta_o) + 2Q}$$

Low-pass $$a_0 = \frac{Q - Q\cos(\theta_o)}{\sin(\theta_o) + 2Q},\ b_1 = \frac{4Q\cos(\theta_o)}{\sin(\theta_o) + 2Q}$$

It should be noted that although some choices have advantages, there is some arbitrariness in choosing which coefficients are independent. For example the bell could have independent $a_0$, $b_1$, and $a_2$.

As will be described in greater detail below, a reference filter is next chosen at step 412. All of the independent coefficients for the reference filter are calculated using the same formulas given above, for the same frequency, but fixed gain (g) and Q (Q) determined as a function of frequency only. These coefficients are chosen from what will be referred to as $A_0$, $A_1$, $A_2$, and $B_1$.

At step 414, all calculated coefficients (both for the reference filter and all but one for the design filter) are combined with zero error using the following formulas that are used to determine the last independent coefficient for the design filter. Once the design filter's coefficients are known based on a calculation when compared to the reference filter, any remaining dependent coefficients (which typically are a function of the type of filter desired) are determined at step 420. Having a fully realized design filter at the desired filter parameters, the method ends at step 422.

A reference filter can be chosen at the same frequency setting, but otherwise somewhat arbitrarily. The formulas can be applied in such a way as to bring the reference filter very close to the desired filter, but with a dependable frequency response. These operations can introduce some changes in the Q, gain, and in extreme cases, the center frequency, but these errors are small where the uncorrected errors are large. All possible errors generated by the invention are thus checked, and boundaries set so that the frequency float correction technique is only used for those combinations of settings that are subject to an unpredictable response and where the technique will not contribute to excessive response error in and of itself (e.g., the decision at step 404).

The method described in FIG. 4 may be further understood by closer inspection to two underlying correction techniques, a filter-type correction technique and a frequency float technique.

Filter-type Correction Technique

A bilinear transformation is typically used to determine the filter coefficient formulas which yields a set of filter-type correction formulas that are the result of simple relationships between the filter coefficients. These formulas are easily derived, but an aspect of filter-type correction is their use after quantization. A bilinear transformation works well except when the design frequency is near the Nyquist frequency. Filter-type correction can be applied in this case, but it is unnecessary, and can possibly conflict with other methods used to remedy Nyquist effects. The design formulas for a bell filter undergoing filter-type correction are:

$$b_1 = -a_1$$

$$b_2 = 1 - a_0 - a_2.$$

As can be seen, the "b" coefficients all depend on the "a" coefficients. These formulas reduce the required computation and have a useful application in the filter-type correction technique. Using the formulas $b_1 = -a_1$ and $b_2 = 1 - a_0 - a_2$ after quantization prevents the most severe aberrations of shelving characteristics and undesired frequency responses by ensuring that the filter will be a valid bell filter, i.e., poles and zeroes are spaced correctly such that the frequency response is close to expectations. Filter-type correction works because there exists a one-to-one mapping between the center frequency, Q, and gain to the coefficients ($a_0$, $a_1$, $a_2$). That is, every set of "a" coefficients ($a_0$, $a_1$, $a_2$), given some reasonable constraints, maps directly to a valid bell filter, and coefficient quantization only results in errors in the frequency, Q and gain parameters. Although a predictable response shape has been achieved, a significant and erratic error still occurs in the frequency. The frequency float technique may be applied to correct this by dialing in one of the coefficients before filter-type correction is applied.

Frequency Float Correction Technique

Figure 5:
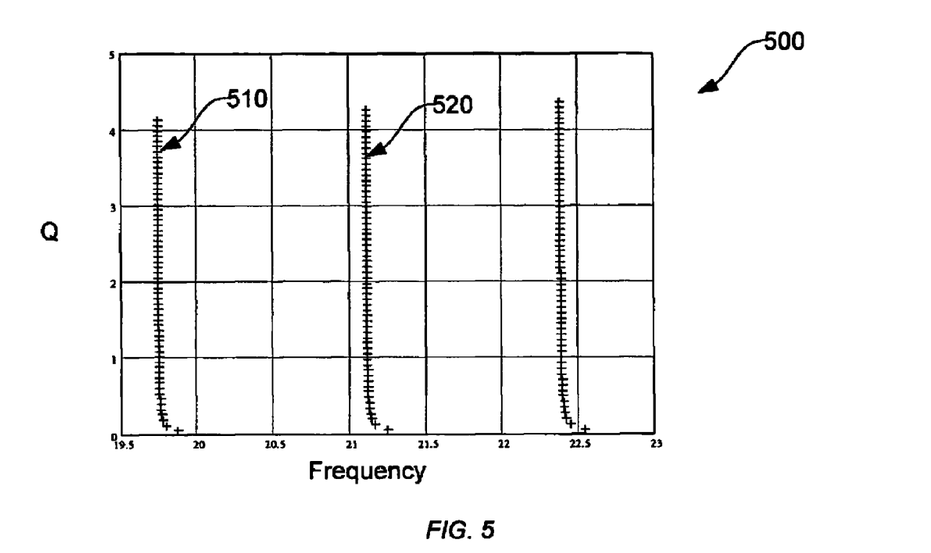
FIG. 5 shows a graphical representation of several plotted parameters of design filters showing the effects of coefficient quantization.

Frequency Float Correction is a technique that supplements the filter-type correction technique and provides precision when designing digital filters for use with low center frequencies. FIG. 5 is a graphical representation of a plot of filter parameters for a typical biquad filter designed without use of a frequency float technique that is described here to illustrate some drawbacks of using only a filter-type correction technique. Filter parameters, frequency, Q, and gain can be thought of as filling a three-dimensional space, and coefficient quantization collapses this into a three-dimensional grid of points. This grid has a structure which is a collection of surfaces, each comprised of a two dimensional grid of points. Each surface is roughly perpendicular (normal) to the frequency axis and represents a design frequency, with a variety of Q and gain values populating the surface. On most of each surface, the frequency variation is extremely small compared to the frequency spacing between surfaces. FIG. 5 shows an edge view of the surfaces, and helps to illustrate both the advantage of and basis for the frequency float technique. As such, frequency and Q are horizontal and vertical, and gain may be thought of as perpendicular to the page. The graph shows only a small fraction of the actual points possible.

Using only filter-type correction, the center frequency "floats" around as the gain or Q are adjusted. For example, when a set of filter parameters are close to both a first center frequency 510 and a second center frequency 520, quantization error necessarily dictates that one of these two frequency bins will be selected as the center frequency (since quantization allows no alternatives) as the Q and the gain is adjusted. Thus, at a first Q, the stable set of parameters may have a center frequency at the frequency 510. However, a slight increase in Q may result in a stable set of parameters such that the center frequency is at the frequency 520. Thus, as small increments in Q are introduced, the frequency may float back and forth between the two center frequencies bins 510 and 520. The frequency falls into one of two bins, seemingly at random, with only tiny frequency variations within a bin.

Figure 6:
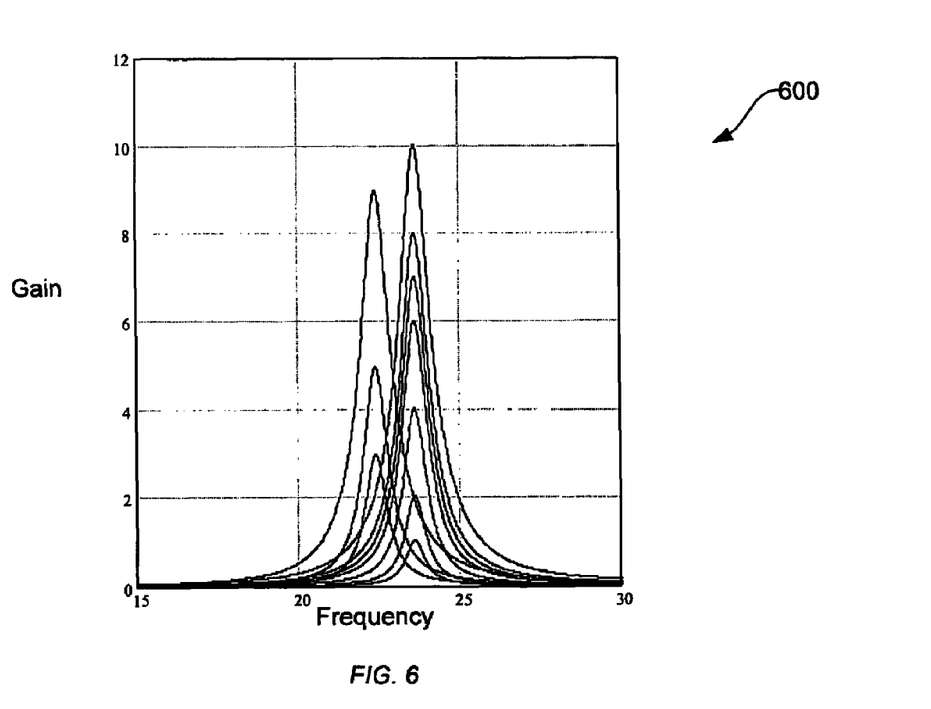
FIG. 6 shows a graphical representation of several frequency responses of a design filter designed using only a filter-type correction technique according to an embodiment of the invention.

As a result, a plot of the frequency response, as shown in FIG. 6, reveals a lack of precision in the center frequency as the gain is changed. Thus, a user cannot reliably count on the center frequency remaining the same as a particular filter's gain is increased or decreased. The frequency float correction technique can alleviate this lack of precision.

As discussed above, by starting with known formulas to design a direct-form biquad bell filter, one may map three parameters (frequency, Q, gain) into five coefficients. A filter-type correction technique simplifies this by making two of them dependent on the other three. If the standard bilinear transformation technique is used, and $b_1$, $b_2$ are determined as above, the reversible mapping (frequency, Q, gain to the coefficients, $a_0$, $a_1$, $a_2$) can be considered by itself. Thus, inverse formulas for a bell filter (boost) are shown below for mapping back to filter parameters and are valid for all coefficient values, as follows:

$$a_0 = \frac{\frac{g}{2Q}\sin(\theta_o)+1}{\frac{1}{2Q}\sin(\theta_o)+1}, \quad a_1 = \frac{-2\cos(\theta_o)}{\frac{1}{2Q}\sin(\theta_o)+1}, \quad a_2 = \frac{1-\frac{g}{2Q}\sin(\theta_o)}{\frac{1}{2Q}\sin(\theta_o)+1}$$

$$\theta_o = \cos^{-1}\left(\frac{-a_1}{a_0+a_2}\right), \quad Q = \frac{0.5\sqrt{(a_0+a_2)^2 - a_1^2}}{2-a_0-a_2}, \quad g = \frac{a_0-a_2}{2-a_0-a_2}$$

Similarly, a bell filter for attenuation (cut) may also be realized:

$$g = 10^{-0.05 \text{ dB}}$$

$$a_0 = \frac{\frac{1}{2Q}\sin(\theta_o)+1}{\frac{g}{2Q}\sin(\theta_o)+1}, \quad a_1 = \frac{-2\cos(\theta_o)}{\frac{g}{2Q}\sin(\theta_o)+1}, \quad a_2 = \frac{1-\frac{1}{2Q}\sin(\theta_o)}{\frac{g}{2Q}\sin(\theta_o)+1}$$

$$\theta_o = \cos^{-1}\left(\frac{-a_1}{a_0+a_2}\right), \quad Q = \frac{0.5\sqrt{(a_0+a_2)^2 - a_1^2}}{a_0-a_2}, \quad g = \frac{2-a_0-a_2}{a_0-a_2}$$

Figure 7:
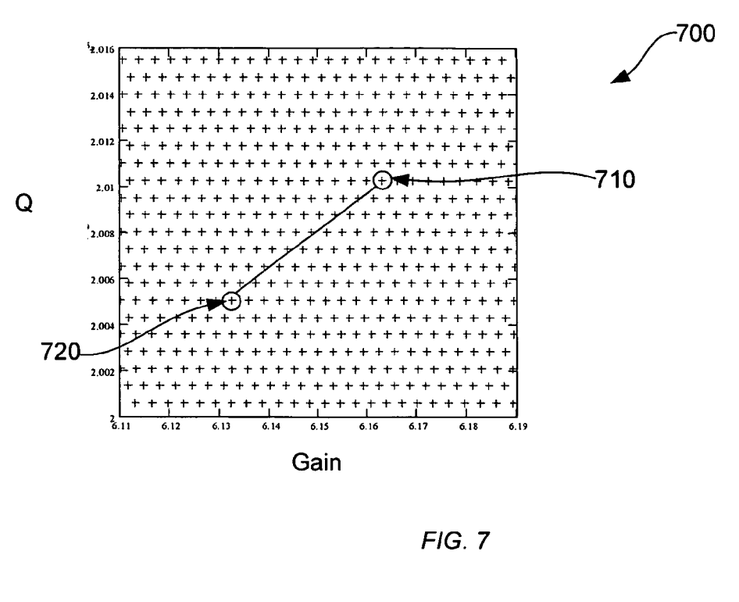
FIG. 7 shows a graphical representation of one surface of parameters of design filters when arbitrarily forced to a specific frequency according to an embodiment of the invention.

All possible bell filters can then be considered to completely fill a three dimensional space of the points identified by frequency, Q, and gain. However, coefficient quantization collapses this into a sparser set, a three dimensional grid of points. This grid has a structure which is a collection of surfaces, each comprised of a two dimensional grid of points as generally represented in FIG. 7. Each surface is roughly perpendicular (normal) to the frequency axis, and so represents a desired center frequency, with a variety of Q and gain values populating the surface. On most of each surface, the frequency variation is extremely small compared to the frequency spacing between surfaces. One such surface 700 is shown in the plot of FIG. 7.

In order to analyze the effect of coefficient quantization on the frequency, the inverse design equations can be differentiated with respect to $a_0$, $a_1$, and $a_2$.

$$\frac{\partial f}{\partial a_0} = \frac{\partial f}{\partial a_2} = \cos(\theta_o)\frac{F_s}{4\pi}\left[\frac{1}{\sin(\theta_o)} + \frac{1}{2Q}\right], \quad \frac{\partial f}{\partial a_1} = \frac{F_s}{4\pi}\left[\frac{1}{\sin(\theta_o)} + \frac{1}{2Q}\right]$$

These equations help to reveal how frequency is affected by quantization, and thereby help to explain the nature of the grid structure. The partial derivatives of frequency with respect to $a_0$, $a_1$, and $a_2$ are almost identical at low design frequencies, differing only by the cosine factor which is very nearly one. A small (least significant bit) change to just a single coefficient ($a_1$ for example) will result in approximately:

$$\Delta a_1 \frac{\partial f}{\partial a_1} = \Delta a_1 \frac{F_s}{4\pi}\left[\frac{1}{\sin(\theta_o)} + \frac{1}{2Q}\right]$$

On the other hand, making a small change in $a_1$ to balance out small changes to $a_0$ and $a_2$ makes for a frequency change of:

$$\Delta f \approx \Delta a_0 \frac{\partial f}{\partial a_0} + \Delta a_1 \frac{\partial f}{\partial a_1} + \Delta a_2 \frac{\partial f}{\partial a_2} \approx (\Delta a_0 + \Delta a_1 + \Delta a_2)\frac{\partial f}{\partial a_0} = 0$$

This holds the frequency constant for all practical purposes, typically significantly smaller than the change resulting from making a quantization step in only one coefficient.

For a typical example, a 20 Hz filter with Q of 4, sample rate of 48 kHz, and delta of $2^{-22}$ (24-bit signed coefficients with 0.5 scaling), this gives 0.348 Hz. If the coefficients are quantized and a one least-significant-bit change to $a_0$ is compensated by an opposite change to $a_1$, the frequency change will be about:

$$\Delta a_0 \frac{\partial f}{\partial a_0} + \Delta a_1 \frac{\partial f}{\partial a_1} = \Delta a_0\left(\frac{\partial f}{\partial a_0} - \frac{\partial f}{\partial a_1}\right)$$

$$= \Delta a_0 (\cos(\theta_o) - 1)\frac{F_s}{4\pi}\left[\frac{1}{\sin(\theta_o)} + \frac{1}{2Q}\right]$$

which from the (cos−1) factor is −3.43e$^{-6}$ times the frequency shift, or −1.19e$^{-6}$ Hz. This huge ratio (1.19e$^{-6}$/0.348) prevents a single least-significant-bit change from making a jump to an adjacent plane. This disparity is reflected in the FIG. 5 by the deviation from vertical, compared to the frequency spacing. This still holds true when total change to ($a_0+a_2$) replaces the change to $a_0$, that is:

$$\Delta a_1 = -(\Delta a_0 + \Delta a_2)$$

As long as the coefficients are already quantized, these incremental changes can be made repeatedly to them with zero error, and in every case no abrupt frequency jump can take place. By mathematical induction, a large exact change of the same form can also have no abrupt frequency jump.

Although making progressively larger changes this way would begin to result in an appreciable frequency shift, typical settings in the (low) frequency range of interest make relatively small changes to coefficients.

Thus, in taking advantage of this relationship, exact design filters may be realized by first starting with a reference filter. Referring back to the method of FIG. 4, the next step after calculating at least some of the design filter coefficients (step 410) is to select a reference filter and calculate each of the coefficients for the reference filter. Thus, for the various desired types of filters, the formulas are:

Bell $$a_1 = A_0 + A_1 + A_2 - a_0 - a_2$$

Band-pass $$b_1 = B_1 + 2A_0 - 2a_0$$

High-pass $$b_1 = B_1 - 2A_0 + 2a_0$$

Other filter types are possible, but are not typically subject to correction methods described herein because response errors are far less prevalent, so these formulas are not presented herein.

Finally, the dependent coefficients are determined with zero error using other simple formulas at step 420. These are given here:

Bell $$b_1 = -a_1$$

$$b_2 = 1 - a_0 - a_2$$

Band-pass $$a_2 = -a_0$$

$$a_1 = 0$$

$$b_2 = 2a_0 - 1$$

High-pass $$a_2 = a_0$$

$$a_1 = -2a_0$$

$$b_2 = b_1 - 4a_0 + 1$$

Low-pass $$a_2 = a_0$$

$$a_1 = 2a_0$$

$$b_2 = 1 - 4a_0 - b_1$$

An alternate method may be used to control the frequency, but this is typically only applicable for special cases because of the possibility of occasional frequency jumps. In this alternate method, a reference filter is designed, its coefficients quantized, and the inverse formula for frequency used to set one of the independent coefficients from the others.

For example, the inverse formula for the bell filter is:

$$F_o = \frac{F_s}{2\pi} \cos^{-1}\left(\frac{-a_1}{a_0 + a_2}\right)$$

Note that filter designs with the same frequency will have equal ratios of $$\frac{a_1}{a_0 + a_2},$$

and so this is all that is required to set the last coefficient. Taking quantization into account:

$$a_1 = Quant(R[Quant(a_0) + Quant(a_2)]),$$

$$R = \frac{Quant(A_1)}{Quant(A_0) + Quant(A_2)}$$

Similar formulas for the band-pass and high-pass filter are:

$$b_1 = Quant(R[1 - Quant(a_0)]), R = \frac{Quant(B_1)}{1 - Quant(A_0)} \text{(band-pass)}$$

$$b_1 = Quant\left(\left[\frac{4R}{1+R}\right]Quant(a_0)\right),$$

$$R = \frac{Quant(B_1)}{4Quant(A_0) - Quant(B_1)} \text{(high-pass)}$$

These are best applied when the primary method contributes excessive error, in place of no correction beyond the previous technique. This is because at low Q (<1) the bin frequencies change progressively faster as the Q is decreased, such that a reference filter frequency at one Q can have continuously moved several frequency bins at another Q, and applying the primary method can result in additional frequency error. For any Q, the alternate method using the inverse formula can have a reference filter frequency exactly between two frequency bins, and frequency jumps are possible.

Therefore, selecting a reference filter (for example, a reference filter that corresponds the graph point 710 in FIG. 7) with calculated coefficients and given an exact change N, where:

$$N = (a_0 + a_2) - (A_0 + A_2),$$

and the change is made to the sum of $A_0$ and $A_2$:

$$(A_0 + A_2) + N = (a_0 + a_2,$$

This is satisfied by the desired $a_0$ and $a_2$ coefficients (it's also satisfied by $a_0 + k$, $a_2 - k$ for any k). Finally, if $a_1$ is set by the complementary change:

$$a_1 = A_1 - N = A_0 + A_1 + A_2 - a_0 - a_2,$$

this results in a design filter 720 that will remain on the same surface 700, with a very small change in frequency, but with possible changes to Q and gain. In general, changes to gain and Q are typically very small, when compared to parameter setting resolution, particularly when the reference filter Q is close to the setting Q.

Yet, another alternate method is to iteratively search nearby sets of quantized coefficients in order to find a set that best fits the reference filter's quantized frequency and the other control parameters, i.e., "trial and error."

Figure 8:
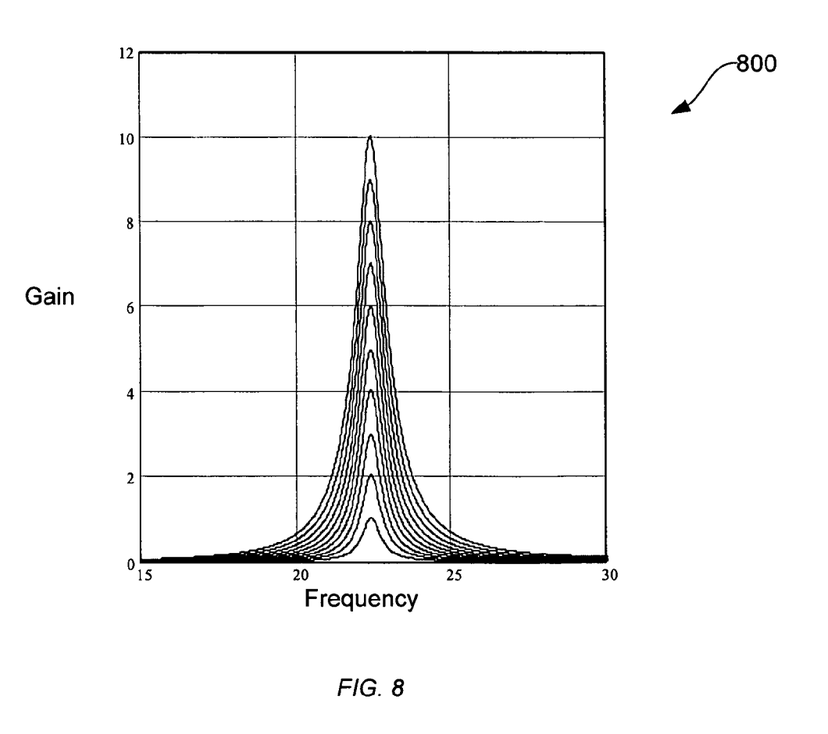
FIG. 8 shows a graphical representation of several frequency responses of a design filter designed using a filter-type correction technique and a frequency float technique according to an embodiment of the invention.

As a result, a plot of the frequency response, as shown in FIG. 8, reveals keen precision with respect to the center frequency as the gain is changed. Thus, a user can reliably count on the center frequency remaining the same as a particular filter's gain is increased or decreased. The frequency float correction technique provides a higher degree of precision than methods known in the prior art.

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

What is claimed is:

1. A method for realizing a filter, the method comprising:
receiving a signal at a digital filtering block of an electronic system;
determining a specific number of coefficients to be calculated for the filter;
calculating the value of some of the coefficients for the filter;
selecting a reference filter having coefficients;
calculating the value of at least some of the coefficients of the reference filter;
determining the value of the remaining uncalculated coefficients of the filter based upon an arithmetic comparison to the coefficients of the reference filter
generating a digital block in a digital filtering block of a electronic system for filtering a signal representing information with the filter such that the information represented changes.

2. The method of claim 1, further comprising quantizing the calculated coefficients prior to determining the value of the remaining uncalculated coefficients.

3. The method of claim 1, further comprising selecting filter parameters including a center frequency, Q, and gain for the filter.

4. The method of claim 3, further comprising determining whether or not to calculate any coefficients of the filter based on an assessment of the filter parameters desired for the filter.

5. The method of claim 3 further comprising calculating coefficients based upon the determined center frequency, Q, and gain.

6. The method of claim 5 wherein the selection of parameters corresponds to a bell filter and the coefficients are calculated based upon:

$$a_0 = \frac{g\sin(\theta_o) + 2Q}{\sin(\theta_o) + 2Q}, a_1 = \frac{-4Q\cos(\theta_o)}{\sin(\theta_o) + 2Q}, a_2 = \frac{2Q - g\sin(\theta_o)}{\sin(\theta_o) + 2Q};$$
$$a_1 = A_o + A_1 + A_2 - a_0 - a_2; \text{ and}$$
$$b_1 = -a_1$$
$$b_2 = 1 - a_0 - a_2.$$

7. The method of claim 5 wherein the selection of parameters corresponds to a band-pass filter and the coefficients are calculated based upon:

$$a_0 = \frac{\sin(\theta_o)}{\sin(\theta_o) + 2Q}, b_1 = \frac{4Q\cos(\theta_o)}{\sin(\theta_o) + 2Q};$$
$$b_1 = B_1 + 2A_0 - 2a_0; \text{ and}$$
$$a_2 = -a_0$$

-continued
$$a_1 = 0$$
$$b_2 = 2a_0 - 1.$$

8. The method of claim 5 wherein the selection of parameters corresponds to a high-pass filter and the coefficients are calculated based upon:

$$a_0 = \frac{Q + Q\cos(\theta_o)}{\sin(\theta_o) + 2Q}, b_1 = \frac{4Q\cos(\theta_o)}{\sin(\theta_o) + 2Q};$$
$$b_1 = B_1 - 2A_0 + 2a_0; \text{ and}$$
$$a_2 = a_0$$
$$a_1 = -2a_0$$
$$b_2 = b_1 - 4a_0 + 1.$$

9. The method of claim 5 wherein the selection of parameters corresponds to a low-pass filter and the coefficients are calculated based upon:

$$a_0 = \frac{Q - Q\cos(\theta_o)}{\sin(\theta_o) + 2Q}, b_1 = \frac{4Q\cos(\theta_o)}{\sin(\theta_o) + 2Q}; \text{ and}$$
$$a_2 = a_0$$
$$a_1 = 2a_0$$
$$b_2 = 1 - 4a_0 - b_1.$$

10. The method of claim 1, further comprising implementing receiving a first user input corresponding to the filter and receiving a second user input corresponding to adjusting the coefficients of the filter.

11. A system for realizing a filter, the system comprising:
an input for a digital signal;
an equalization component coupled to the input having at least one user-configurable filter, the equalization component including a filter realization component operable to:
  determine a specific type of filter to be realized, the filter having a defined number of coefficients that correspond to filter elements;
  calculate the value of some of the coefficients for the filter;
  select a reference filter having coefficients;
  calculate the value of the coefficients of the reference filter; and
  determine the value of the remaining coefficients of the filter based upon an arithmetic comparison to the coefficients of the reference filter; and
an output for a filtered digital signal coupled to the equalization component.

12. The system of claim 11, further comprising a user interface embodied in a computer platform and having software-enabled control features such that a user is operable to control the equalization component via the software executing on the computer platform.

13. The system of claim 11, further comprising an analog-to-digital converter for converting an audio signal from analog to digital prior to the input and a digital-to-analog converter for converting the audio signal from digital to analog after the output.

14. The system of claim 11 wherein the filter comprises a filter from the group comprising a peaking filter, a bell-filter, a parametric filter, a band-pass filter, a band-cut filter, a low-pass filter, a high-pass filter, a low-cut filter, a high-cut filter, a high-shelf filter, a low-shelf filter, and a unity filter.

15. The system of claim 11 embodied within a rack-mountable standalone outboard device.

* * * * *